(12) United States Patent
Inamura et al.

(10) Patent No.: US 8,346,499 B2
(45) Date of Patent: Jan. 1, 2013

(54) SEMICONDUCTOR DEVICE AND ITS TESTING METHOD (75) Inventors: Tadayuki Inamura, Kanagawa (JP); Masahiro Tozuka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 299 days.

(21) Appl. No.: 12/883,825

(22) Filed: Sep. 16, 2010

(65) Prior Publication Data
US 2011/0071786 A1 Mar. 24, 2011

(30) Foreign Application Priority Data
Sep. 18, 2009 (JP) .................................. 2009-216571

(51) Int. Cl.
*G01R 29/00* (2006.01)
(52) U.S. Cl. ........................................................ 702/120
(58) Field of Classification Search .................. 702/120, 702/117, 118, 182–185
See application file for complete search history.

(56) References Cited

U.S. PATENT DOCUMENTS

2004/0025123 A1* 2/2004 Angilivelil ......................... 716/4
2008/0211531 A1* 9/2008 Gattiker et al. ............... 324/765

FOREIGN PATENT DOCUMENTS
JP 62-204171 A 9/1987
JP 5-251534 A 9/1993

* cited by examiner

*Primary Examiner* — Edward Raymond
(74) *Attorney, Agent, or Firm* — Foley & Lardner LLP (57) ABSTRACT

A semiconductor device 100 including an internal circuit 4 that operates based on an input pattern includes a clock driver 25 that generates an internal clock 7 based on a generated clock 6, a counter 23 that generates count data 28 by counting the generated clock 6, a nonvolatile storage device 22 that stores storage data 27 used in an IDDQ test, a comparator 24 that stops the generation of the internal clock 7 by the clock driver 25 when the count data 28 and the storage data 27 match each other, and a pseudo random number generation circuit 3 that supplies a pseudo random number 8 to the internal circuit 4 in synchronization with the internal clock 7.

8 Claims, 6 Drawing Sheets

SEMICONDUCTOR DEVICE AND ITS TESTING METHOD

INCORPORATION BY REFERENCE

This application is based upon and claims the benefit of priority from Japanese patent application No. 2009-216571, filed on Sep. 18, 2009, the disclosure of which is incorporated herein in its entirety by reference.

BACKGROUND

1. Field of the Invention

The present invention relates to a semiconductor device and its testing method.

2. Description of Related Art

A burn-in test has been known as a reliability test of a semiconductor device. Among the burn-in tests, there are a static burn-in test and a dynamic burn-in test. For example, Patent document 1 (Japanese Unexamined Patent Application Publication No. 05-251534) discloses a technique to test the reliability of a semiconductor device with efficiency by alternately performing a dynamic burn-in test and a static burn-in test.

Figure 6:
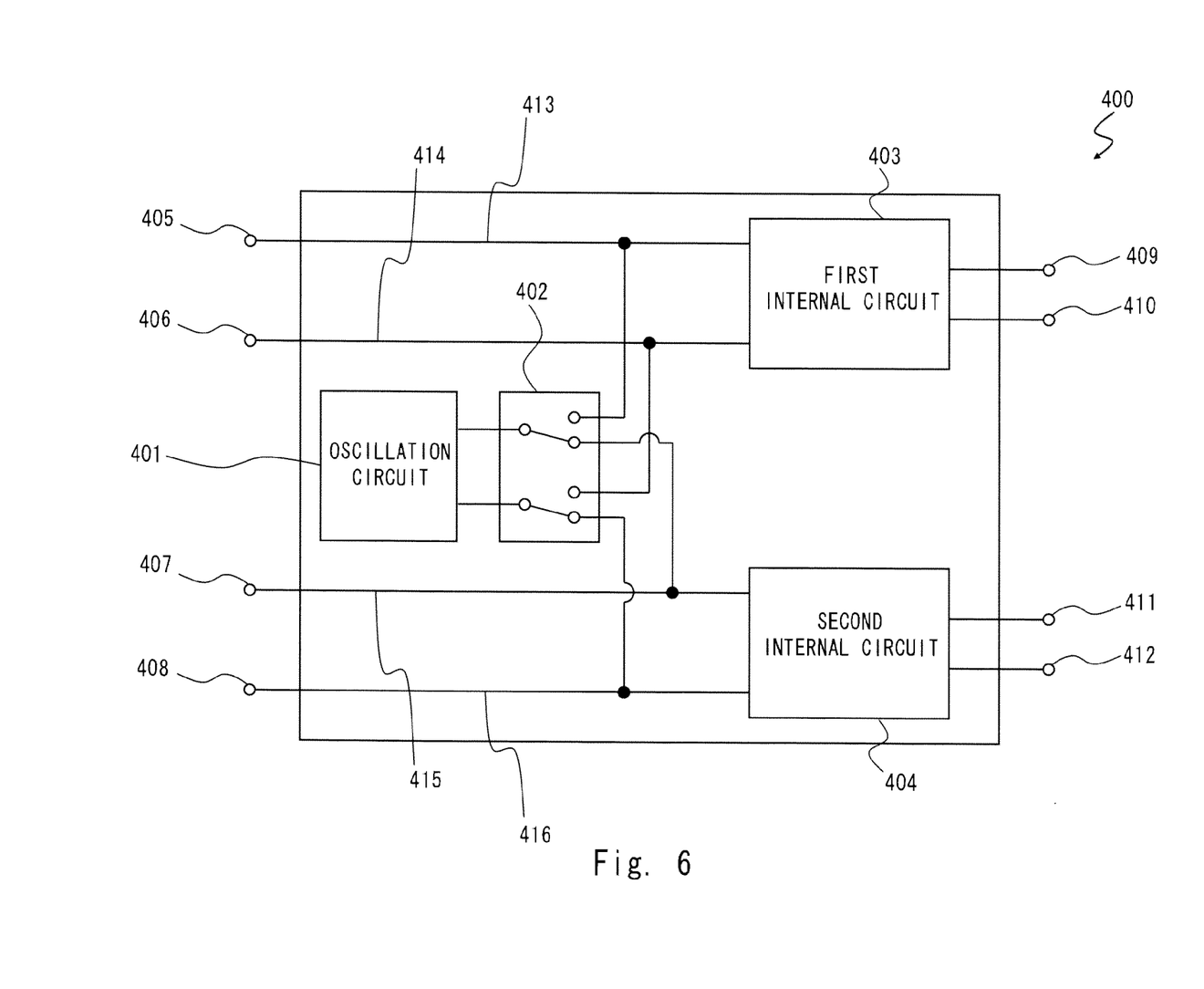
FIG. 6 is a block diagram showing an example of a configuration of a semiconductor device in related art.

FIG. 6 shows a block diagram illustrating a semiconductor device disclosed in Patent document 1. As shown in FIG. 6, an input terminal 405 is connected to a signal line 413. Further, an input terminal 406 is connected to a signal line 414. Further, the signal lines 413 and 414 are connected to input terminals of a first internal circuit 403. Further, input terminals 407 and 408 are connected to signal lines 415 and 416 respectively. Further, the signal lines 415 and 416 are connected to input terminals of a second internal circuit 404. Further, the signal lines 413, 414, 415 and 416 are also connected to output terminals of a switch circuit 402. Further, an oscillation circuit 401 is connected to input terminals of the switch circuit 402.

During a normal operation, external signals are input to the input terminals 405, 406, 407 and 408. Meanwhile, during a burn-in test, the input terminals 405, 406, 407 and 408 are in an open state.

Further, the oscillation circuit 401 stops its operation during the normal operation, whereas it oscillates during the burn-in test.

Further, during the burn-in test, the switch circuit 402 switches between a state where an output signal of the oscillation circuit 401 is propagated to the signal lines 413 and 414 while the signal lines 415 and 416 are fixed at a ground level and a state where an output signal of the oscillation circuit 401 is propagated to the signal lines 415 and 416 while the signal lines 413 and 414 are fixed at a ground level. Further, the switch circuit 402 puts the signal lines 413, 414, 415 and 416 into a high-impedance state during the normal operation.

During the burn-in test, when the switch circuit 402 is switched and set to a state where the output signal of the oscillation circuit 401 is propagated to the signal lines 413 and 414, the first internal circuit 403 becomes a dynamic burn-in test state and the second internal circuit 404 becomes a static burn-in test state. During the burn-in test, when the switch circuit 402 is switched and set to a state where the output signal of the oscillation circuit 401 is propagated to the signal lines 415 and 416, the first internal circuit 403 becomes a static burn-in test state and the second internal circuit 404 becomes a dynamic burn-in test state. In this manner, by switching the switch circuit 402, the dynamic burn-in test and the static burn-in test can be alternately performed during the burn-in test.

Further, Patent document 2 (Japanese Unexamined Patent Application Publication No. 62-204171) discloses a technique to perform switching between a dynamic burn-in test and a static burn-in test by using a timer.

SUMMARY

However, the present inventors have found a problem that in the technique disclosed in Patent document 1, there are transistors for which the degradation of the gate oxide film cannot be sufficiently accelerated in the dynamic burn-in test. Therefore, there is a problem that the burn-in test needs to be performed for a long time to repeatedly apply a stress to the gate oxide film.

Specifically, in the case of a CMOS circuit including Nch transistors and Pch transistors, it would be ideal if a static burn-in test is performed while all the Nch transistors are set to an On-state and then another static burn-in test is performed while all the Pch transistors are set to an On-state. However, it is technically very difficult to set all the Nch transistors to an On-state, and to set all the Pch transistors to an On-state.

Further, in the burn-in test, a stress is applied to the gate oxide film of the semiconductor device by applying a voltage so that the degradation of the gate oxide film is accelerated. However, in the dynamic burn-in test, there are transistors that are more likely to become an On-state as well as transistors that are less likely to become an On-state according to the circuit configuration. In the technique disclosed in Patent document 1, there are transistors for which the degradation of the gate oxide film cannot be sufficiently accelerated by a short-time dynamic burn-in test. Therefore, the dynamic burn-in test does not necessarily ensure that a uniform stress is applied to the gate oxide film of all the transistors. Further, during the dynamic burn-in test, the internal state is changed whenever the clock is input. In addition, the operation of the circuit cannot be controlled from the outside. Therefore, the problem that a sufficient stress cannot be applied to the gate oxide film of transistors that are less likely to become an On-state remains unsolved. Further, the need for the testing technique that enables the effective application of a stress to gate oxide films has been growing.

Further, the technique disclosed in Patent document 1 does not give any consideration to the toggle rate of each of the first internal circuit 403 and the second internal circuit 404 that is exhibited when the first internal circuit 403 is changed from a dynamic burn-in test to a static burn-in test by switching the switch circuit 402 or when the second internal circuit 404 is changed from a dynamic burn-in test to a static burn-in test. Note that in an IDDQ test, the test is performed while the internal state of the semiconductor device is set to a plurality of states where the toggle rate is high by using a test pattern generated by a test pattern generation tool. Therefore, it is possible to effectively degrade the gate oxide film in a short time by performing a static burn-in test by using the same pattern as that of the IDDQ test during the burn-in test disclosed in Patent document 1. However, as described above, the internal state of the semiconductor device cannot be controlled during the burn-in test in the technique disclosed in Patent document 1. Therefore, in the dynamic burn-in test, the input signals to the internal circuits cannot be controlled to the same pattern as that in the IDDQ test.

Further, the technique disclosed in Patent document 2 has also a problem that it is necessary to set a timer in advance to perform a burn-in test for a long time so that a stress is applied to the gate oxide film to accelerate the degradation thereof.

Further, the technique disclosed in Patent document 2 also does not give any consideration to the toggle rate of the internal circuits.

A first exemplary aspect of the present invention is a semiconductor device including an arithmetic circuit unit that operates based on an input pattern. Further, the semiconductor device includes an internal clock generation unit, a clock count unit, a storage unit, a clock generation stop control unit, and a test pattern generation unit. The internal clock generation unit generates an internal clock based on a burn-in test clock. Further, the clock count unit generates clock count data by counting the burn-in test clock. Further, the storage unit stores IDDQ test clock count data used in an IDDQ test. Further, the clock generation stop control unit stops the generation of the internal clock by the internal clock generation unit when the clock count data matches the IDDQ test clock count data. Further, the test pattern generation unit supplies an IDDQ test pattern to the arithmetic circuit unit in synchronization with the internal clock.

In accordance with the first exemplary aspect of the present invention, in a burn-in test of a semiconductor device, an internal clock is generated based on a burn-in test clock by the internal clock generation unit, and an IDDQ test pattern is input to the arithmetic circuit unit in synchronization with the internal clock by the test pattern generation unit. Further, in the burn-in test of the semiconductor device, a burn-in test clock is counted by the clock count unit to generate clock count data. Then, when the clock count data matches the IDDQ test clock count data stored in the storage unit, the generation of the internal clock by the internal clock generation unit is stopped by the clock generation stop control unit. As a result, the input of the IDDQ test pattern to the arithmetic circuit unit by the test pattern generation unit is also stopped.

In other words, in the burn-in test of the semiconductor device, the IDDQ test pattern is input to the arithmetic circuit unit for a duration substantially equal to that of the IDDQ test indicated by the IDDQ test clock count data. In this way, in the burn-in test, the internal state of the semiconductor device can be brought into the same state as that exhibited when the IDDQ test is performed. That is, in the burn-in test, the internal toggle rate of the semiconductor device can be sufficiently increased. As a result, in the burn-in test, a gate oxide film(s) of the semiconductor device can be effectively degraded in a short time.

A second exemplary aspect of the present invention is a testing method of a semiconductor device including an arithmetic circuit unit that operates based on an input pattern. Further, the testing method includes an internal clock generation process, a clock count process, a storage process, a clock generation stop control process, and a test pattern generation process. In the internal clock generation process, an internal clock is generated based on a burn-in test clock. Further, in the clock count process, clock count data is generated by counting the burn-in test clock. Further, in the storage process, IDDQ test clock count data used in an IDDQ test is stored. Further, in the clock generation stop control process, the generation of the internal clock in the internal clock generation process is stopped when the clock count data matches the IDDQ test clock count data. Further, in the test pattern generation process, an IDDQ test pattern is input to the arithmetic circuit unit in synchronization with the internal clock.

In accordance with the second exemplary aspect of the present invention, in a burn-in test of a semiconductor device, an internal clock is generated based on a burn-in test clock in the internal clock generation process, and an IDDQ test pattern is input to the arithmetic circuit unit in synchronization with the internal clock in the test pattern generation process. Further, in the burn-in test of the semiconductor device, a burn-in test clock is counted in the clock count process to generate clock count data. Then, when the clock count data matches the IDDQ test clock count data stored in the storage process, the generation of the internal clock in the internal clock generation process is stopped in the clock generation stop control process. As a result, the input of the IDDQ test pattern to the arithmetic circuit unit in the test pattern generation process is also stopped.

In other words, in the burn-in test of the semiconductor device, the IDDQ test pattern is input to the arithmetic circuit unit for a duration substantially equal to that of the IDDQ test indicated by the IDDQ test clock count data. In this way, in the burn-in test, the internal state of the semiconductor device can be brought into the same state as that exhibited when the IDDQ test is performed. That is, in the burn-in test, the internal toggle rate of the semiconductor device can be sufficiently increased. As a result, in the burn-in test, a gate oxide film(s) of the semiconductor device can be effectively degraded in a short time.

In accordance with the present invention, in a burn-in test, a gate oxide film(s) of a semiconductor device can be effectively degraded in a short time.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Exemplary embodiments of the present invention are explained hereinafter with reference to the drawings.

Figure 1:
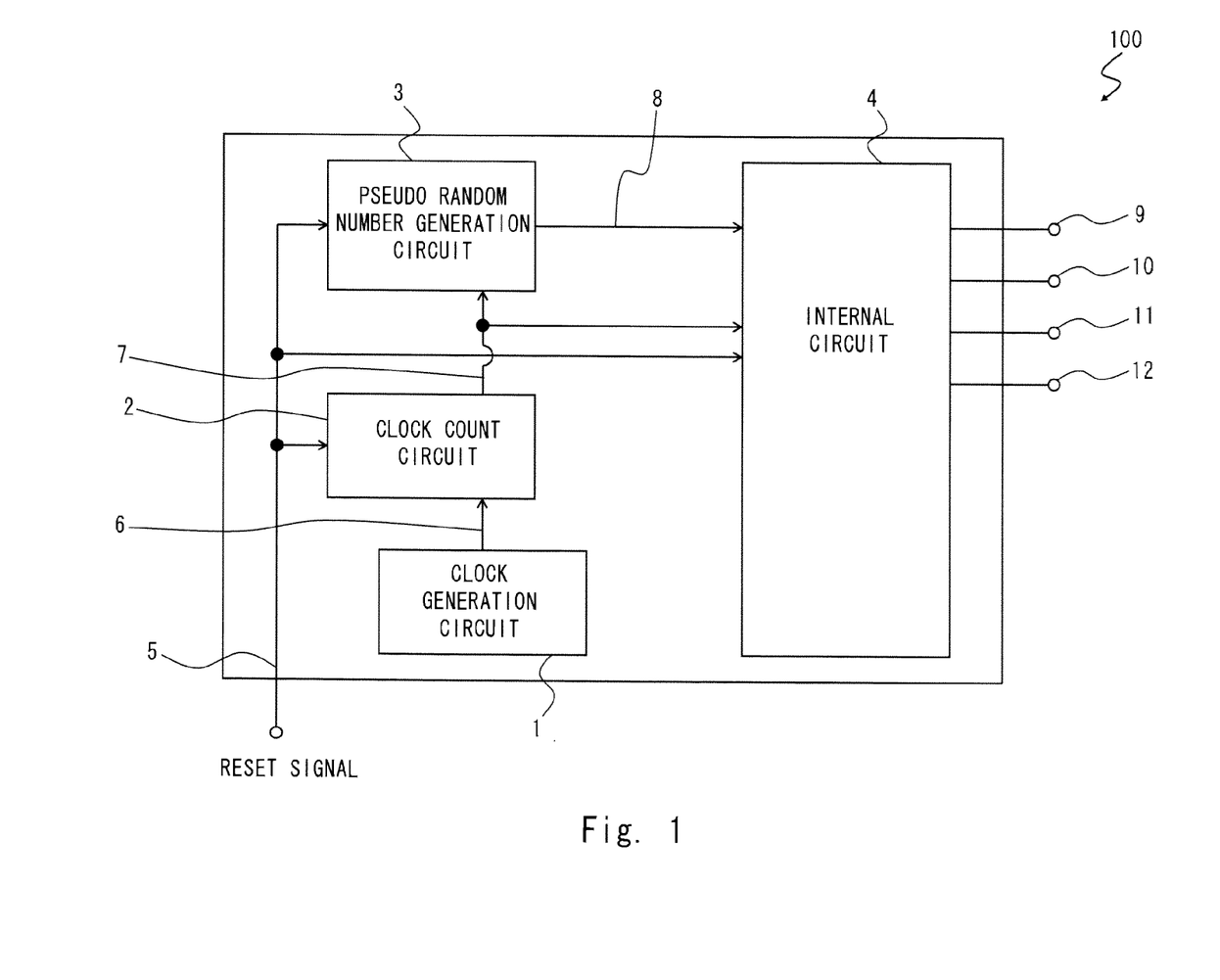
FIG. 1 is a block diagram showing an example of a configuration of a semiconductor device in accordance with a first exemplary embodiment of the present invention.

FIG. 1 is a block diagram showing an example of a configuration of a semiconductor device 100 in accordance with a first exemplary embodiment of the present invention. As shown in FIG. 1, the semiconductor device 100 includes a clock generation circuit 1 (test clock generation unit), a clock count circuit 2, a pseudo random number generation circuit 3 (test pattern generation unit), an internal circuit 4 (arithmetic circuit unit), and so on.

When the semiconductor device 100 is set to a burn-in test mode, the clock generation circuit 1 outputs a generated clock 6 (burn-in test clock).

The generated clock 6 generated by the clock generation circuit 1 is input to the clock count circuit 2. Further, a reset signal 5, which is externally supplied to the semiconductor device 100, is also input to the clock count circuit 2. Then, after being reset by the reset signal 5, the clock count circuit 2 counts the generated clock 6 and outputs an internal clock 7.

The internal clock 7 generated by the clock count circuit 2 is input to the pseudo random number generation circuit 3. Further, the reset signal 5, which is externally supplied to the semiconductor device 100, is also input to the pseudo random number generation circuit 3. Then, after being reset by the reset signal 5, the pseudo random number generation circuit 3 outputs a pseudo random number 8 (IDDQ test pattern) in synchronization with the internal clock 7.

The pseudo random number 8 generated by the pseudo random number generation circuit 3 is input to the internal circuit 4. Further, the internal clock 7 generated by the clock count circuit 2 is also input to the internal circuit 4. Furthermore, the reset signal 5, which is externally supplied to the semiconductor device 100, is also input to the internal circuit 4. Then, after being reset by the reset signal 5, the internal circuit 4 operates by using the pseudo random number 8 as an input pattern in synchronization with the internal clock 7. Then, the operation result of the internal circuit 4 is output from output terminals 9, 10, 11 and 12 to the outside of the semiconductor device 100.

Figure 2:
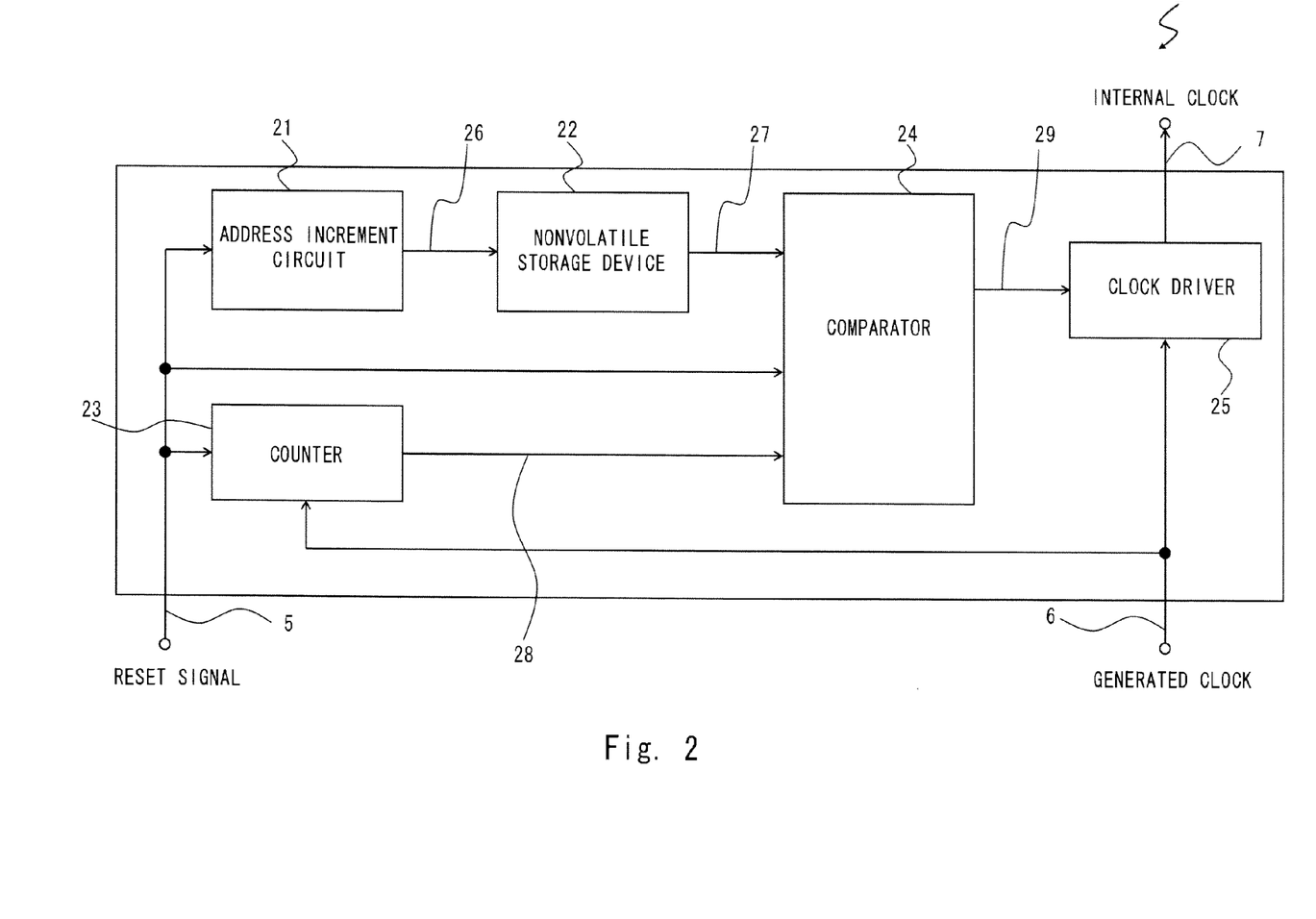
FIG. 2 is a block diagram showing an example of a configuration of a clock count circuit in accordance with a first exemplary embodiment of the present invention.

FIG. 2 shows a block diagram showing an example of a configuration of a clock count circuit 2 in accordance with the first exemplary embodiment of the present invention.

As shown in FIG. 2, the clock count circuit 2 includes an address increment circuit 21, a nonvolatile storage device 22 (storage unit), a counter 23 (clock count unit), a comparator 24 (clock generation stop control unit), a clock driver 25 (internal clock generation unit), and so on.

The reset signal 5 is input to the address increment circuit 21. Then, the address increment circuit 21 updates an address 26 by using a rising-edge signal of the reset signal 5 as an increment signal. The updated address 26 is input to the nonvolatile storage device 22. In this way, the address increment circuit 21 increments the address 26 of the nonvolatile storage device 22.

The address 26 updated by the address increment circuit 21 is input to the nonvolatile storage device 22. As a result, the address 26 of the nonvolatile storage device 22 is incremented. Then, the nonvolatile storage device 22 outputs storage data 27 (IDDQ test clock count data) based on the address 26. Note that when the address 26 of the nonvolatile storage device 22 is incremented to the last address, it returns to the initial address 26.

The reset signal 5 is input to the counter 23. Further, the generated clock 6 is also input to the counter 23. Then, after being reset by the reset signal 5, the counter 23 counts the generated clock 6 and outputs count data 28 (clock count data).

The reset signal 5, the storage data 27, and the count data 28 are input to the comparator 24. Then, after being reset by the reset signal 5, the comparator 24 compares the storage data 27 with the count data 28. When the storage data 27 and the count data 28 match each other, the comparator 24 outputs an internal clock stop signal 29.

The generated clock 6 and the internal clock stop signal 29 are input to the clock driver 25. Then, the clock driver 25 outputs the internal clock 7 to the outside of the clock count circuit 2 in synchronization with the generated clock 6 until the internal clock stop signal 29 is input to the clock driver 25.

Figure 3:
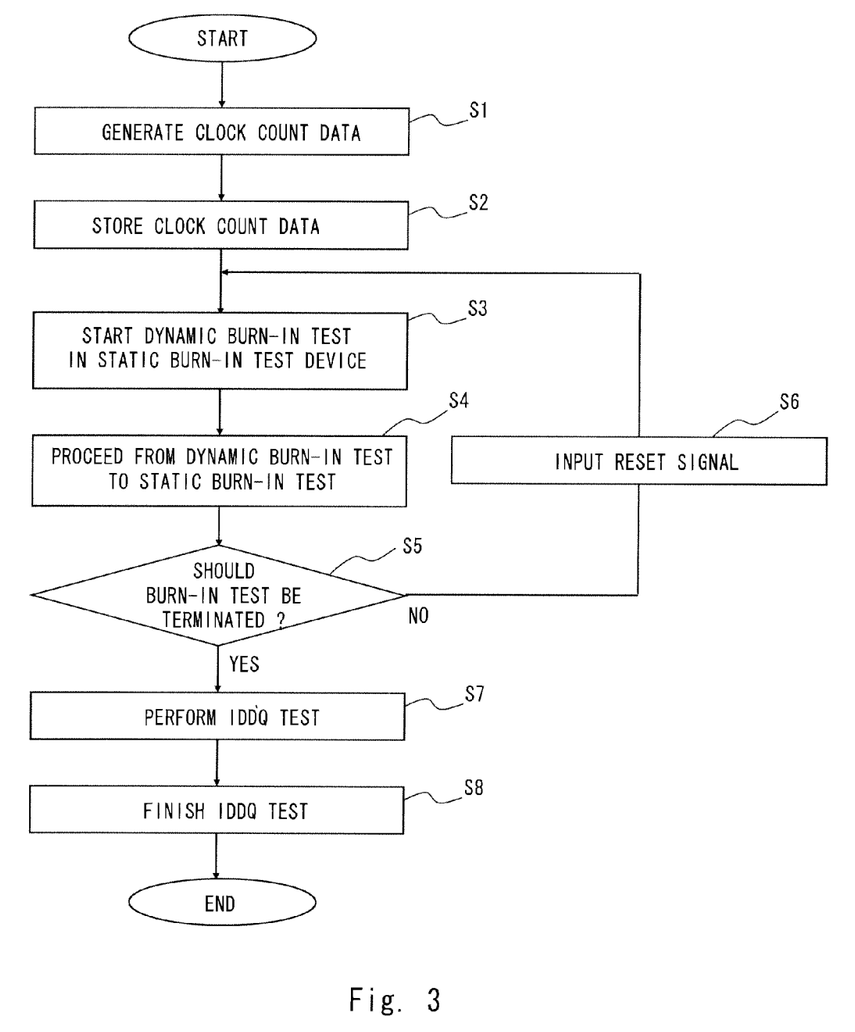
FIG. 3 is a flowchart for explaining an example of a testing method in accordance with a first exemplary embodiment of the present invention.

Next, a testing method of testing the reliability of the semiconductor device 100 in accordance with the first exemplary embodiment of the present invention is explained with reference to a flowchart shown in FIG. 3.

Firstly, a test pattern generation tool is executed by an EWS (Engineering Workstation) or a PC (Personal Computer), which is different from the semiconductor device 100, in order to generate IDDQ test clock count data that is used in an IDDQ test performed in a step S7 (step S1).

Next, the IDDQ test clock count data generated in the step S1 is input from the EWS or the PC to the semiconductor device 100 and stored as storage data 27 in the nonvolatile storage device 22 (step S2: storage process).

Next, a dynamic burn-in test starts to be performed on the semiconductor device 100 by using a static burn-in test device.

Specifically, when the burn-in test is started, the clock generation circuit 1 supplies a generated clock 6 to the clock count circuit 2 (test clock generation process).

Further, a reset signal 5 is input to the address increment circuit 21 of the clock count circuit 2. As a result, a first address 26 is input from the address increment circuit 21 to the nonvolatile storage device 22. Next, first storage data 27 is input from the nonvolatile storage device 22 to the comparator 24.

Further, when the reset signal 5 is input to the counter 23 of the clock count circuit 2, the counter 23 counts the generated clock 6 and generates count data 28. The count data 28 is input to the comparator 24 (clock count process).

Next, the comparator 24 compares the count data 28 with the storage data 27 every time the count data 28 is input from the counter 23. Then, only when the count data 28 and the storage data 27 match each other, the internal clock stop signal 29 is input from the comparator 24 to the clock driver 25 (clock generation stop control process).

Therefore, the clock driver 25 supplies the internal clock 7 to the pseudo random number generation circuit 3 and the internal circuit 4 until the internal clock stop signal 29 is input to the clock driver 25 (internal clock generation process).

Further, the pseudo random number generation circuit 3 supplies a pseudo random number 8 to the internal circuit 4 in synchronization with the internal clock 7 (test pattern generation process).

Then, the internal circuit 4 operates by using the pseudo random number 8 input from the pseudo random number generation circuit 3 as an input pattern in synchronization with the internal clock 7.

In this way, the dynamic burn-in test can be implemented by using the static burn-in test device.

Next, the process proceeds from the dynamic burn-in test to a static burn-in test (step S4).

Specifically, when the count data 28 matches the storage data 27, the internal clock stop signal 29 is input from the comparator 24 to the clock driver 25. Then, the clock driver 25 stops the supply of the internal clock 7 to the pseudo random number generation circuit 3 and the internal circuit 4. In this way, the dynamic burn-in test is stopped and a static burn-in test is started.

Note that the IDDQ test clock count data, which is used in the step S7, is already stored as the storage data 27 in the nonvolatile storage device 22 by the process in the step S2. Therefore, the storage data 27, which is compared with the count data 28 by the comparator 24 in the step S4, reflects this IDDQ test clock count data. Accordingly, in the step S4, i.e., at the time when the process proceeds from the dynamic burn-in test to the static burn-in test, the internal state of the semiconductor device 100 is the same state as that exhibited when the IDDQ test is performed in the step S7. In other words, at the time when the process proceeds from the dynamic burn-in test to the static burn-in test (at the time of the step S4), the internal toggle rate of the semiconductor device 100 is sufficiently high. Therefore, the static burn-in test can be started in a state where the internal toggle rate of the semiconductor device 100 is sufficiently high. In this way, a stress can be effectively applied to a gate oxide film(s) of the semiconductor device 100.

Next, whether the burn-in test should be terminated or not is determined (step S5). This determination is made by the person conducting the test.

In a step S5, when it is determined that the burn-in test should not be terminated (step S5: No), the reset signal 5 is input to the semiconductor device 100 (step S6) and the process returns to the step S3.

Note that since the reset signal 5 is also input to the address increment circuit 21 in the step S6, the address increment circuit 21 updates the address 26. Then, every time the updated address 26 is input from the address increment circuit 21, next storage data 27 is input from the nonvolatile storage device 22 to the comparator 24. Therefore, by repeating the process from the step S3 to the step S6, the static burn-in test is performed in all the states indicated by the IDDQ test clock count data generated in the step S1.

In the step S5, when it is determined that the burn-in test should be terminated (step S5: Yes), an IDDQ test is performed in a state where the semiconductor device 100 is set to the burn-in test mode (step S7). Note that a sufficient stress has been already applied to the gate oxide film of the semiconductor device 100 in the step S4. Therefore, the IDDQ test in the step S7 can be performed in a state where a sufficient stress has been applied to the internal state of the semiconductor device 100. Accordingly, the screening of the semiconductor device 100 can be effectively performed. Note that the IDDQ test is a test to detect a fault(s) in the semiconductor device by measuring the static power-supply current (IDDQ) of the semiconductor device.

Next, the IDDQ test is finished (step S8) and the reliability test of the semiconductor device 100 is finished.

According to the semiconductor device 100 and the testing method of the semiconductor device 100 in accordance with the first exemplary embodiment of the present invention explained above, in a burn-in test of the semiconductor device 100, an internal clock 7 is generated based on the generated clock 6 by the clock driver 25, and a pseudo random number 8 is supplied to the internal circuit 4 in synchronization with the internal clock 7 by the pseudo random number generation circuit 3. Further, in a burn-in test of the semiconductor device 100, the generated clock 6 is counted by the counter 23 to generate count data 28. Then, when the count data 28 matches storage data 27 stored in the nonvolatile storage device 22, the generation of the internal clock 7 by the clock driver 25 is stopped by the comparator 24. As a result, the supply of the pseudo random number 8 to the internal circuit 4 by the pseudo random number generation circuit 3 is also stopped.

In other words, in a burn-in test of the semiconductor device 100, the pseudo random number 8 is input to the internal circuit 4 for a duration substantially equal to that of the IDDQ test indicated by the storage data 27. In this way, in the burn-in test, the internal state of the semiconductor device 100 can be brought into the same state as that exhibited when the IDDQ test is performed. That is, in the burn-in test, the internal toggle rate of the semiconductor device 100 can be sufficiently increased. As a result, in the burn-in test, a gate oxide film(s) of the semiconductor device 100 can be effectively degraded in a short time.

Further, the semiconductor device 100 includes the clock generation circuit 1 that generates a generated clock 6. Furthermore, the clock generation circuit 1 supplies the generated clock 6 to the clock driver 25 and the counter 23 in the burn-in test.

In this way, a dynamic burn-in test can be implemented by using a static burn-in test device.

[Second Exemplary Embodiment]

Figure 4:
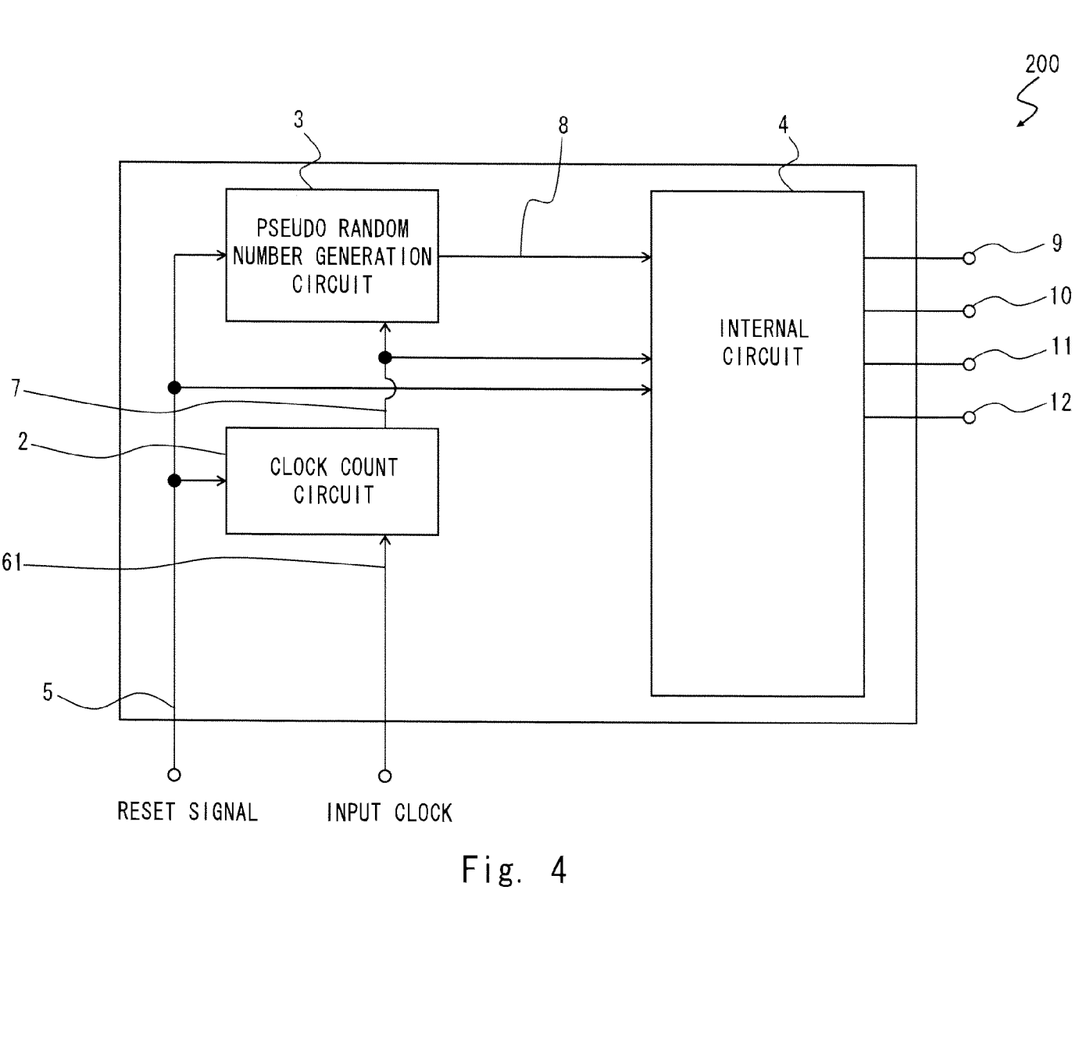
FIG. 4 is a block diagram showing an example of a configuration of a semiconductor device in accordance with a second exemplary embodiment of the present invention.

FIG. 4 is a block diagram showing an example of a configuration of a semiconductor device 200 in accordance with a second exemplary embodiment of the present invention. As shown in FIG. 4, the semiconductor device 200 in accordance with the second exemplary embodiment is different from the semiconductor device 100 in accordance with the first exemplary embodiment only in that the semiconductor device 200 does not includes the clock generation circuit 1 and that an input clock 61 is input to the clock count circuit 2 instead of the generated clock 6. Therefore, the same components and structures are denoted by the same signs and their explanation is omitted.

The input clock 61 is supplied from a dynamic burn-in test device. When a dynamic burn-in test device is used, the input clock 61 is input from the dynamic burn-in test device to the semiconductor device 200. Therefore, the semiconductor device 200 does not need to be equipped with the clock generation circuit 1. Therefore, the testing method of the semiconductor device 200 is substantially the same as that of the semiconductor device 100 except that the test clock generation process is omitted.

[Third Exemplary Embodiment]

Figure 5:
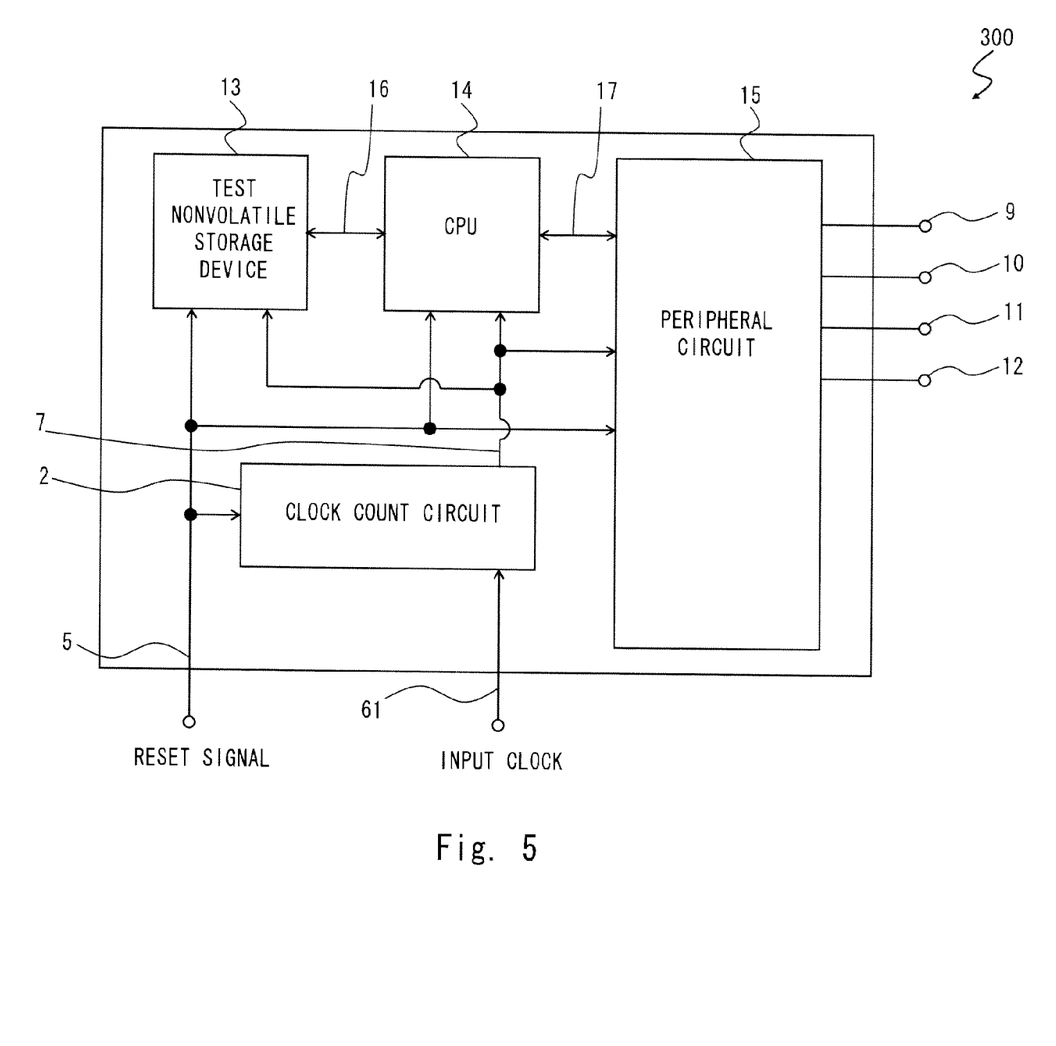
FIG. 5 is a block diagram showing an example of a configuration of a semiconductor device in accordance with a third exemplary embodiment of the present invention.

FIG. 5 is a block diagram showing an example of a configuration of a semiconductor device 300 in accordance with a third exemplary embodiment of the present invention. As shown in FIG. 5, the semiconductor device 300 in accordance with the third exemplary embodiment is different from the semiconductor device 100 in accordance with the first exemplary embodiment in that the semiconductor device 300 does not includes the clock generation circuit 1 and that an input clock 61 is input to the clock count circuit 2 instead of the generated clock 6. Further, the semiconductor device 300 in accordance with the third exemplary embodiment is also different from the semiconductor device 100 in accordance with the first exemplary embodiment in that the semiconductor device 300 includes a test nonvolatile storage device 13 (test storage unit) and a CPU (Central Processing Unit) 14 in place of the pseudo random number generation circuit 3. Furthermore, the semiconductor device 300 in accordance with the third exemplary embodiment is also different from the semiconductor device 100 in accordance with the first exemplary embodiment in that the semiconductor device 300 includes a peripheral circuit 15 (arithmetic circuit unit) in place of the internal circuit 4. Accordingly, the same components and structures are denoted by the same signs and their explanation is omitted.

The test nonvolatile storage device 13 stores an IDDQ test pattern 16. Further, a reset signal 5 and an internal clock 7 are input to the test nonvolatile storage device 13. Then, after being reset by the reset signal 5, the test nonvolatile storage device 13 supplies the IDDQ test pattern 16 to the CPU 14 in synchronization with the internal clock 7.

The reset signal 5, the internal clock 7, and the IDDQ test pattern 16 are input to the CPU 14. Then, after being reset by the reset signal 5, the CPU 14 supplies an instruction 17 based on the IDDQ test pattern 16 to the peripheral circuit 15 in synchronization with the internal clock 7.

The reset signal 5, the internal clock 7, and the instruction 17 are input to the peripheral circuit 15. Then, after being reset by the reset signal 5, the peripheral circuit 15 operates according to the instruction 17 in synchronization with the internal clock 7. Then, the operation result of the peripheral circuit 15 is output from output terminals 9, 10, 11 and 12 to the outside of the semiconductor device 300.

The input clock 61 is supplied from the dynamic burn-in test device. When a dynamic burn-in test device is used, the input clock 61 is input from the dynamic burn-in test device to the semiconductor device 300. Therefore, the semiconductor device 300 does not need to be equipped with the clock generation circuit 1.

Accordingly, the testing method of the semiconductor device 300 is substantially the same as that of the semiconductor device 100 except that the test clock generation process is omitted and that the instruction 17 based on the IDDQ test pattern 16 is input from the CPU 14 to the peripheral circuit 15 in the test pattern generation process.

The first, second and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device comprising an arithmetic circuit unit that operates based on an input pattern, further comprising:
    an internal clock generation unit that generates an internal clock based on a burn-in test clock;
    a clock count unit that generates clock count data by counting the burn-in test clock;
    a storage unit that stores IDDQ test clock count data used in an IDDQ test;
    a clock generation stop control unit that stops generation of the internal clock by the internal clock generation unit when the clock count data matches the IDDQ test clock count data; and
    a test pattern generation unit that supplies an IDDQ test pattern to the arithmetic circuit unit in synchronization with the internal clock.

2. The semiconductor device according to claim 1, further comprising a test clock generation unit that generates the burn-in test clock, wherein the test clock generation unit supplies the burn-in test clock to the internal clock generation unit and the clock count unit in a burn-in test.

3. The semiconductor device according to claim 1, wherein
    the test pattern generation unit comprises a test storage unit that stores the IDDQ test pattern, and
    the test pattern generation unit supplies the IDDQ test pattern stored in the test storage unit to the arithmetic circuit unit in synchronization with the internal clock.

4. The semiconductor device according to claim 2, wherein
    the test pattern generation unit comprises a test storage unit that stores the IDDQ test pattern, and
    the test pattern generation unit supplies the IDDQ test pattern stored in the test storage unit to the arithmetic circuit unit in synchronization with the internal clock.

5. A testing method of a semiconductor device comprising an arithmetic circuit unit that operates based on an input pattern, the method comprising:
    an internal clock generation process of generating an internal clock based on a burn-in test clock;
    a clock count process of generating clock count data by counting the burn-in test clock;
    a storage process of storing IDDQ test clock count data used in an IDDQ test;
    a clock generation stop control process of stopping generation of the internal clock in the internal clock generation process when the clock count data matches the IDDQ test clock count data; and
    a test pattern generation process of supplying an IDDQ test pattern to the arithmetic circuit unit in synchronization with the internal clock.

6. The testing method of a semiconductor device according to claim 5, further comprising a test clock generation process of generating the burn-in test clock in a burn-in test.

7. The testing method of a semiconductor device according to claim 5, wherein
    the test pattern generation process comprises a test storage process of storing the IDDQ test pattern, and
    in the test pattern generation process, the IDDQ test pattern stored in the test storage process is input to the arithmetic circuit unit in synchronization with the internal clock.

8. The testing method of a semiconductor device according to claim 6, wherein
    the test pattern generation process comprises a test storage process of storing the IDDQ test pattern, and
    in the test pattern generation process, the IDDQ test pattern stored in the test storage process is input to the arithmetic circuit unit in synchronization with the internal clock.

* * * * *